(12) United States Patent
Hutzler et al.

(10) Patent No.: US 10,403,728 B2
(45) Date of Patent: Sep. 3, 2019

(54) SEMICONDUCTOR DEVICES HAVING FIELD ELECTRODE TRENCHES

(71) Applicant: Infineon Technologies Austria AG, Villach (AT)

(72) Inventors: Michael Hutzler, Villach (AT); Christoph Gruber, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/235,027

(22) Filed: Dec. 28, 2018

(65) Prior Publication Data

US 2019/0140059 A1    May 9, 2019

Related U.S. Application Data

(62) Division of application No. 15/592,804, filed on May 11, 2017, now Pat. No. 10,199,468.

(30) Foreign Application Priority Data

May 13, 2016    (DE) .......................... 10 2016 108 943

(51) Int. Cl.
    *H01L 29/40*    (2006.01)
    *H01L 29/78*    (2006.01)
    (Continued)

(52) U.S. Cl.
    CPC .......... *H01L 29/407* (2013.01); *H01L 21/768* (2013.01); *H01L 29/401* (2013.01);
    (Continued)

(58) Field of Classification Search
    CPC . H01L 29/407; H01L 23/485; H01L 21/7681; H01L 29/66727; H01L 29/66734;
    (Continued)

(56) References Cited

U.S. PATENT DOCUMENTS 9,041,098 B2 *   5/2015   Ichinoseki ............ H01L 29/407
                                                         257/330
2009/0085106 A1   4/2009   Matsunaga
                  (Continued)

FOREIGN PATENT DOCUMENTS

DE    102006036347 B4    1/2012
DE    102005052734 B4    2/2012
              (Continued)

OTHER PUBLICATIONS

Hwaiyu, Geng, "Semiconductor Manufacturing Handbook", McGraw-Hill Handbooks, 2005, pp. 4.2-4.6.

*Primary Examiner* — Thanh T Nguyen
(74) *Attorney, Agent, or Firm* — Murphy, Bilak & Homiller, PLLC

(57) ABSTRACT

A semiconductor device includes needle-shaped trenches in a semiconductor substrate, each of which includes a field electrode electrically insulated from the semiconductor substrate. Source doping regions and body doping regions of a transistor arrangement are formed in the semiconductor substrate between neighboring ones of the needle-shaped trenches. Gate trenches extend through the source doping regions and the body doping regions. The device further includes a first insulation layer above the semiconductor substrate, an etch stop layer on the first insulation layer, a second insulation layer on the etch stop layer, and an electrically conductive material on the second insulation layer and which contacts the field electrodes, source doping regions and body doping regions through openings which extend through the second insulation layer, etch stop layer and first insulation layer. Islands of the electrically conductive material are surrounded by portions of the second insulation layer above the gate trenches.

18 Claims, 16 Drawing Sheets

(51) Int. Cl.
*H01L 21/768* (2006.01)
*H01L 29/739* (2006.01)
*H01L 29/417* (2006.01)

(52) U.S. Cl.
CPC .......... *H01L 29/404* (2013.01); *H01L 29/408* (2013.01); *H01L 29/41708* (2013.01); *H01L 29/41766* (2013.01); *H01L 29/7397* (2013.01); *H01L 29/7813* (2013.01)

(58) Field of Classification Search
CPC . H01L 29/408; H01L 29/404; H01L 29/7397; H01L 29/7813; H01L 29/41766; H01L 29/401; H01L 29/41708; H01L 21/768
See application file for complete search history.

(56) References Cited

U.S. PATENT DOCUMENTS

| | | | | |
|---|---|---|---|---|
| 2012/0292694 A1* | 11/2012 | Hsieh | ................... | H01L 29/407 257/331 |
| 2012/0307508 A1 | 12/2012 | Fukui et al. | | |
| 2013/0313638 A1* | 11/2013 | Yoshimochi | ........ | H01L 21/8232 257/334 |
| 2014/0110777 A1* | 4/2014 | Peng | ................... | H01L 29/4236 257/330 |
| 2014/0117438 A1 | 5/2014 | Meiser et al. | | |
| 2016/0079351 A1* | 3/2016 | Yamashita | .......... | H01L 29/0634 257/330 |
| 2016/0293714 A1 | 10/2016 | Hutzler et al. | | |
| 2017/0084703 A1 | 3/2017 | Ku et al. | | |

FOREIGN PATENT DOCUMENTS

| | | |
|---|---|---|
| DE | 102013108614 A1 | 2/2014 |
| DE | 102014110655 A1 | 2/2015 |
| DE | 102014112338 A1 | 3/2016 |

\* cited by examiner

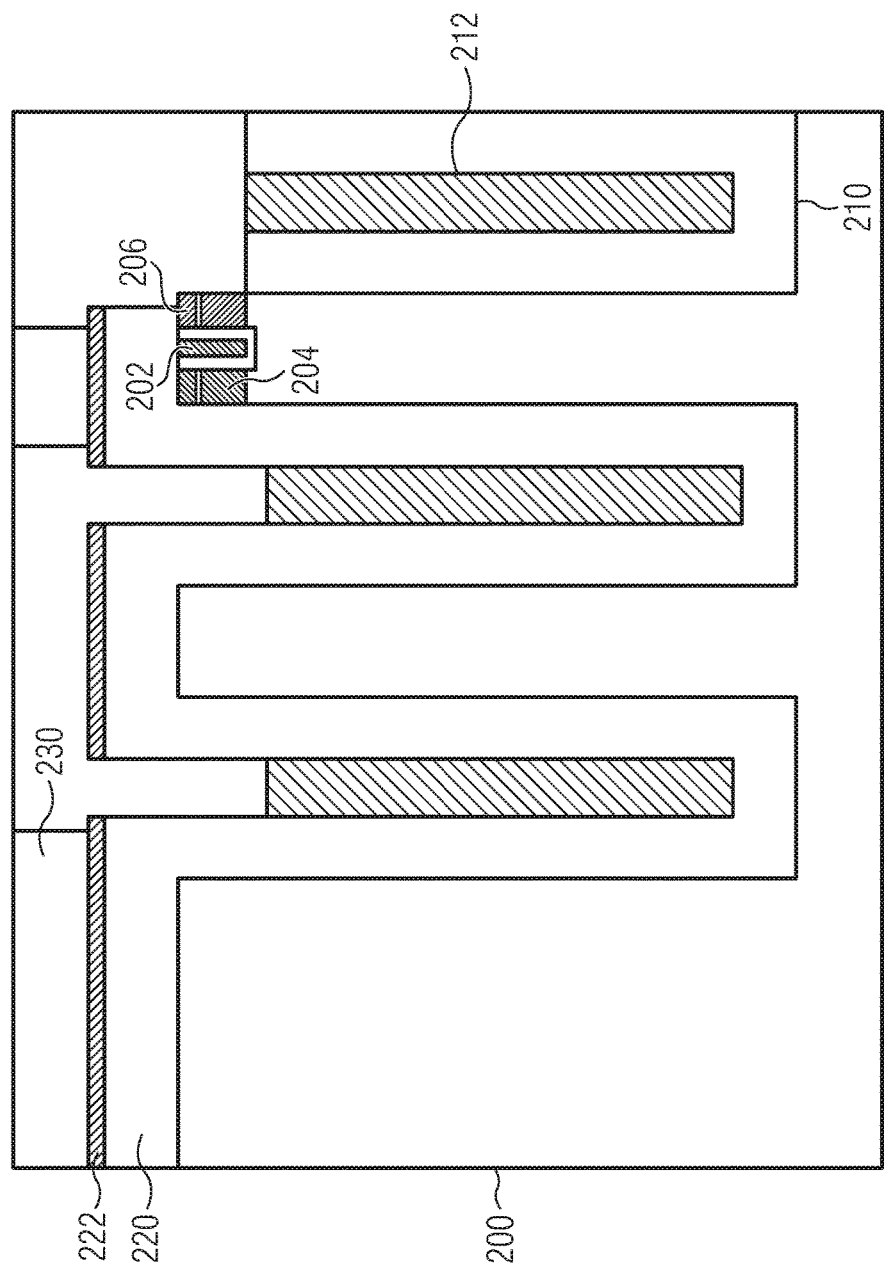

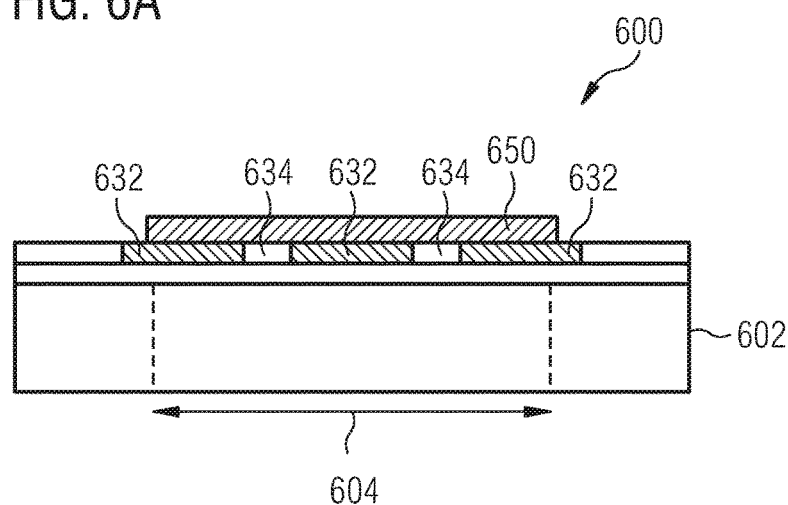
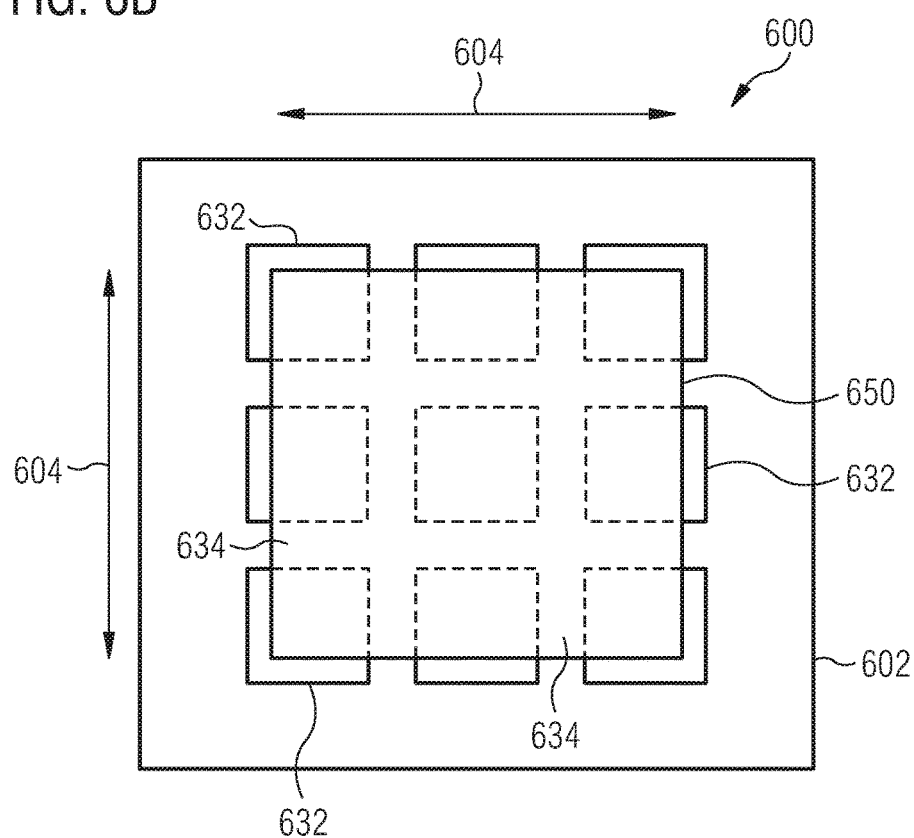

US 10,403,728 B2

SEMICONDUCTOR DEVICES HAVING FIELD ELECTRODE TRENCHES

TECHNICAL FIELD

Embodiments relate to concepts for manufacturing semiconductor devices and in particular to methods for forming a semiconductor devices, semiconductor devices and power semiconductor devices.

BACKGROUND

Various processes for manufacturing semiconductor devices are known. Shrinking the dimensions of structures of semiconductor devices becomes more and more difficult. Further, surfaces with large topographies cause difficulties during formation and structuring of layers on top of such surfaces. This may lead to a high defect density.

SUMMARY

It may be a demand to provide an improved concept for forming semiconductor devices, which allows to increase the yield and/or to reduce the defect density.

Some embodiments relate to a method for forming a semiconductor device. The method comprises forming a first insulation layer on a semiconductor substrate and forming a structured etch stop layer. Further, the method comprises depositing a second insulation layer after forming the structured etch stop layer and forming a structured mask layer on the second insulation layer. Additionally, the method includes etching portions of the second insulation layer uncovered by the structured mask layer and portions of the first insulation layer uncovered by the structured etch stop layer to uncover at least one of a portion of the semiconductor substrate and an electrode located within a trench. Further, the method comprises depositing electrically conductive material to form an electrical contact to at least one of the uncovered electrode and the uncovered portion of the semiconductor substrate.

Some embodiments relate to a semiconductor device comprising a semiconductor substrate and a layer stack comprising at least an insulation layer, a structured etch stop layer and a lower most lateral wiring layer. The insulation layer is located adjacent to the semiconductor substrate and the structured etch stop layer is located between the insulation layer and the lower most lateral wiring layer. Further, a wiring structure comprises a vertical wiring portion extending from the lower most lateral wiring layer vertically to at least one of the semiconductor substrate and an electrode located within a trench. The vertical wiring portion and electrical conductive portions of the lower most lateral wiring layer are manufacturable simultaneously.

Some embodiments relate to a power semiconductor device comprising a semiconductor substrate comprising an electrical element arrangement located within a cell region of the semiconductor substrate. A blocking voltage of the electrical element arrangement is higher than 10V. Further, the semiconductor device comprises a lateral wiring layer. One or more electrically conductive structures of the lateral wiring layer are embedded by insulating material of the lateral wiring layer. Portions of the insulating material of the lateral wiring layer are located within the cell region. Additionally, the semiconductor device comprises a metal layer located on the lateral wiring layer. The metal layer covers the portions of the insulating material of the lateral wiring layer within the cell region.

BRIEF DESCRIPTION OF THE FIGURES

Some embodiments of apparatuses and/or methods will be described in the following by way of example only, and with reference to the accompanying figures, in which:

FIG. 2a-2j show schematic cross sections of a part of a semiconductor device at different manufacturing stages;

FIGS. 6a and 6b show a schematic cross section and a schematic top view of a power semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
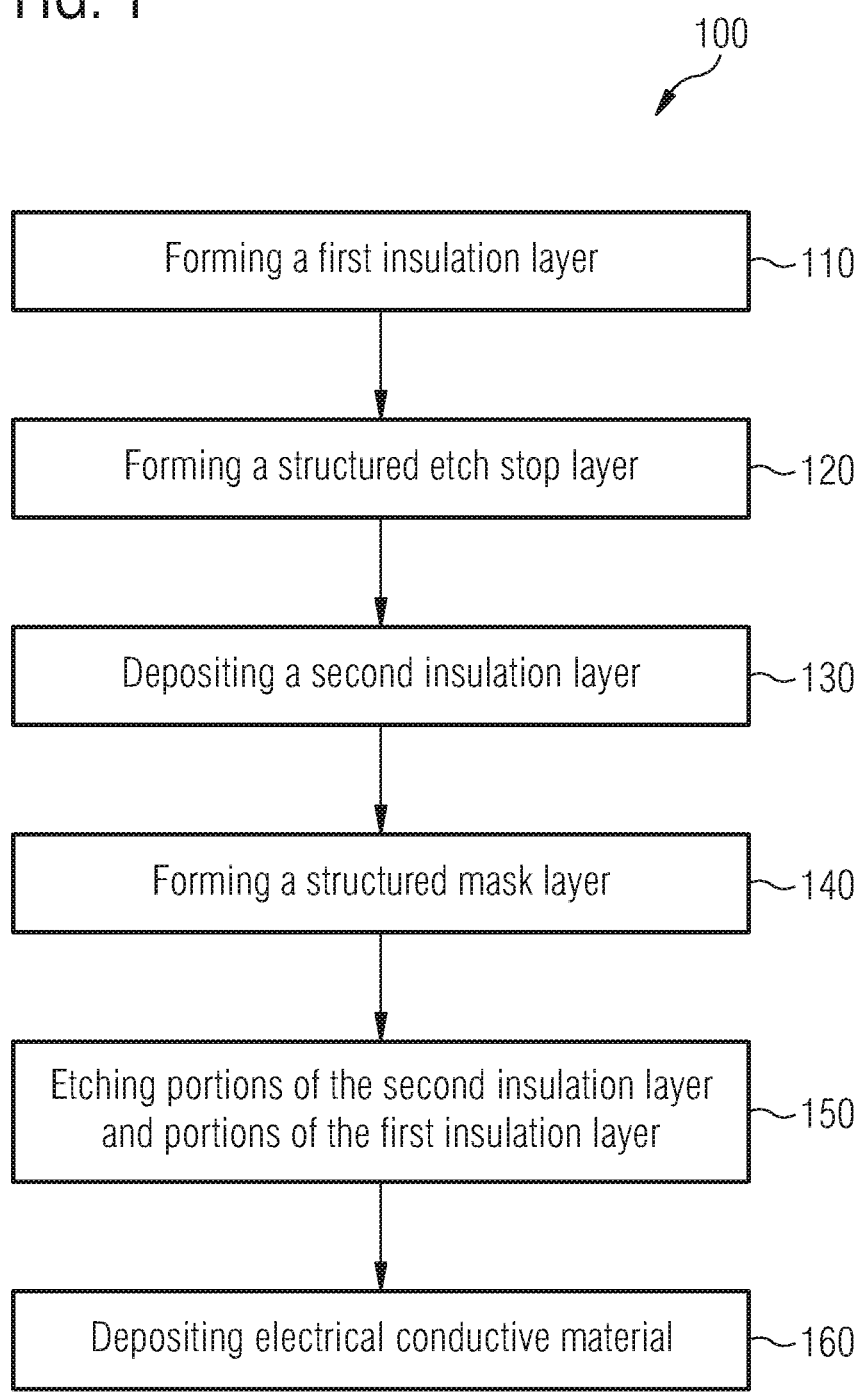
FIG. 1 shows a flow chart of a method for forming a semiconductor device.

FIG. 1 shows a flow chart of a method for forming a semiconductor device according to an embodiment. The method 100 comprises forming 110 a first insulation layer on a semiconductor substrate and forming 120 a structured etch stop layer on the first insulation layer. Further, the method 100 comprises depositing 130 a second insulation layer after forming 120 the structured etch stop layer and forming 140 a structured mask layer on the second insulation layer. Additionally, the method 100 includes etching 150 portions of the second insulation layer uncovered by the structured mask layer and portions of the first insulation layer uncovered by the structured etch stop layer to uncover a portion of the semiconductor substrate and/or an electrode located within a trench. Further, the method 100 comprises depositing 160 electrically conductive material to form an electrical contact to the uncovered electrode and/or the uncovered portion of the semiconductor substrate.

By using a structured mask layer between two insulation layers, a lateral and vertical wiring structure for contacting electrodes in trenches and/or for contacting the semiconductor substrate may be formable. Further, a planarization by chemical-mechanical polishing may be enabled, since the electrically conductive material is embedded in the insulation layers. In this way, a substantially even surface may be provided for following manufacturing processes. Therefore, the defect density may be reduced and/or the yield may be increased.

The first insulation layer may be formed 110 (e.g. deposited) directly on a (front side) surface of the semiconductor substrate. Alternatively, a thin insulation layer (e.g. remaining from a thermal oxidation of a gate oxide) may already cover the semiconductor substrate at the time of forming 110 the first insulation layer (e.g. pre metal dielectric layer). The first insulation layer may be a silicon oxide layer (e.g. silicon dioxide, undoped silicon glass USG, phosphosilicate glass PSG or borophosphosilicate glass BPSG). The first insulation layer may comprise a thickness selected based on a voltage class of the semiconductor device to be formed. For example, the first insulation layer may comprise a thickness between 300 nm and 3 µm (or between 500 nm and 2 µm).

The structured etch stop layer may be formed 120 directly on the first insulation layer (e.g. directly after forming the first insulation layer). The structured etch stop layer may be formed 120 by depositing an etch stop layer and structuring the etch stop layer based on a lithography process. Portions of the etch stop layer may be removed during structuring at least at areas selected for a vertical electrically conductive connection through the first insulation layer. The etch stop layer may comprise a thickness of less than 20% (or less than 10% or less than 5%) of a thickness of the first insulation layer and/or a thickness of the second insulation layer. For example, the etch stop layer may be a silicon nitride layer or any other material which can be etched selectively to oxide, for example.

The second insulation layer may be deposited 130 directly on the structured etch stop layer (e.g. directly after forming the etch stop layer). The second insulation layer may be a silicon oxide layer (e.g. silicon dioxide, phosphosilicate glass PSG or borophosphosilicate glass BPSG). The first insulation layer and the second insulation layer may comprise substantially the same material (e.g. neglecting impurities and dopants as boron and phosphorous, for example). For example, the second insulation layer may comprise a thickness between 100 nm and 800 nm (or between 300 nm and 600 nm).

The structured mask layer may be formed 140 directly on the second insulation layer (e.g. directly after forming the second insulation layer). The structured mask layer may be a photo resist layer or a hard mask layer (e.g. silicon nitride) structured based on a lithography process. Portions of the mask layer may be removed during structuring at least at areas selected for an electrically conductive wiring structure to be embedded in the second insulation layer.

After forming the structured mask layer, portions of the first and second insulation layer are etched 150 (e.g. by a dry chemical etching process). The portions of the first and second insulation layer may be etched 150 simultaneously during the same etching process. The used etching process may be a strongly anisotropic etching process to avoid a significant under etch of the second insulation layer below the structured mask layer and the first insulation layer below the structured etch stop layer. For example, the etching process etches portions of the second insulation layer, which are not covered by the structured mask layer, but may stop or may be significantly decelerated when reaching the structured etch stop layer. Consequently, only portions of the first insulation layer, which are not covered by the structured etch stop layer, may be etched while the etching process is continued after reaching the level of the structured etch stop layer. The etching process may be continued until a portion of the semiconductor substrate or an electrode within a trench (extending into the semiconductor substrate) is uncovered.

For example, the first insulation layer and the second insulation layer comprise material selectively etchable (e.g. with significantly different etch rates) with respect to the material of the structured etch stop layer. For example, the etching 150 of the second insulation layer and the first insulation layer may be performed by an etching process (e.g. dry chemical etching) having an etch rate for material of the etch stop layer of less than 20% (or less than 10% or less than 5%) of an etch rate for material of the first insulation layer and/or for material of the second insulation layer. In this way, the first insulation layer remains at areas covered by the structured etch stop layer during the etching 150.

After etching portions of the first insulation layer and the second insulation layer and uncovering one or more portions of the surface of the semiconductor substrate and/or one or more electrodes within one or more trenches, electrically conductive material is deposited 160 (e.g. by sputtering, growing or chemical vapor deposition CVD). The electrically conductive material may be deposited as a single electrically conductive layer (e.g. tungsten layer, aluminum layer, copper layer or polysilicon layer) or as a stack of electrically conductive layers (e.g. titanium layer, titanium nitride layer and tungsten layer Ti/TiN/W). The deposited electrically conductive material may fill the space of the portions of the first insulation layer and the second insulation layer removed during the preceding etching 150 (e.g. neglecting voids within the electrically conductive material due to manufacturing effects). The electrically conductive material may be deposited with a thickness larger than a sum of a thickness of the first insulation layer and a thickness of the second insulation layer. The deposited electrically conductive material implements an electrically conductive contact to one or more portions of the semiconductor substrate (e.g. source doping region and/or body doping region of a transistor arrangement, cathode doping region or anode doping region of a diode arrangement) and/or an electrode (e.g. field electrode or gate electrode) within a trench (e.g. gate trench or field plate trench) extending into the semiconductor substrate.

For example, the deposited electrically conductive material embedded within the first and second insulation layer may be formed based on a damascene or dual damascene process.

For example, the method 100 may further comprise removing a part of the electrical conductive material until portions of the second insulation layer are uncovered. For example, a part of the electrical conductive material is removed by chemical-mechanical polishing CMP or a plasma etch planarization process. CMP may be applicable, since the relevant portion of the deposited electrical conductive material, which should remain, is embedded in the first and second insulation layer. The CMP process may be stopped at the second insulation layer. In this way, a substantially planar surface may be provided for further processing (e.g. forming further layers). A surface of a lateral wiring layer (e.g. formed by the remaining insulation material of the second insulation layer and the portion of the electrical conductive material embedded in the remaining insulation material of the second insulation layer) may be obtained by CMP of the electrical conductive material. For example, the insulation material of the second insulation layer remaining after etching 150 and the portion of the electrically conductive material embedded in the remaining insulation material of the second insulation layer form a lateral wiring layer (e.g. lower most metal layer of the layer stack of the semiconductor device).

The portions of the second insulation layer uncovered after removing the part of the electrical conductive material may laterally surround islands of the electrical conductive material. The portions of material of the second insulation layer may suppress dishing effects during CMP, for example. For example, the portions of the remaining insulation material of the second insulation layer surrounding electrical conductive material may be located within a cell region of the semiconductor device to be formed. The portions of the remaining insulation material located within the cell region may be uncovered during the chemical-mechanical polishing.

For example, the method 100 may further comprise etching an array of field electrode trenches (e.g. strip-shaped trenches or needle-shaped trenches) into the semiconductor substrate and/or etching at least one gate trench (e.g. plurality of parallel gate trenches or a gate trench grid) into the semiconductor substrate before forming the first insulation layer.

Further, the method 100 may comprise forming field electrodes within the array of field electrode trenches and/or forming one or more gate electrodes of a transistor arrangement within the one or more gate trenches before forming the first insulation layer. The electrical conductive material may be deposited 160 to form an electrical contact to the field electrodes within the array of field electrode trenches and/or the one or more gate electrodes.

For example, the array of field electrode trenches may be an array of needle-shaped trenches. The needle-shaped trenches of the array of needle-shaped trenches may comprise a maximal lateral extension (e.g. in one lateral direction) of less than 2 times a minimal lateral extension (e.g. in another lateral direction), for example. For example, a needle-shaped trench comprising a lateral circular shape has a maximal lateral dimension equal to a minimal lateral dimension or a needle-shaped trench comprising a lateral square shape has a maximal lateral dimension equal to the length of a diagonal of the square and a minimal lateral dimension equal to the length of a side of the square. The needle-shaped trenches of the array of needle-shaped trenches may comprise a minimal lateral dimension of more than 200 nm and/or less than 10 µm (or more than 500 nm and/or less than 3 µm), for example. Further, the needle-shaped trenches of the array of needle-shaped trenches may comprise a depth of more than the minimal lateral extension and/or more than the maximal lateral dimension. For example, the needle-shaped trenches of the array of needle-shaped trenches may extend into a depth of more than 10 µm (or more than 20 µm, more than 50 µm or more than 80 µm). The needle-shaped trenches of the array of needle-shaped trenches may comprise a lateral geometry being one of a rectangular geometry, square geometry, round geometry, hexagonal geometry and octagonal geometry, for example.

The needle-shaped trenches of the array of needle-shaped trenches may be distributed periodically over at least a portion (e.g. cell region) of the semiconductor substrate. The array of needle-shaped trenches may be distributed in a two-dimensional grid of substantially equal distances, for example. For example, the array of needle-shaped trenches may be distributed in a square grid, a rectangular grid, a staggered grid or a hexagonal grid. For example, the array of needle-shaped trenches may comprise more than 50 (or more than 100, more than 200 or more than 500) needle-shaped trenches.

For example, the needle-shaped trenches of the array of needle-shaped trenches may comprise field electrodes connected to a source wiring structure of a transistor arrangement.

The field electrodes may enable to vertically enlarge a depletion region of the transistor arrangement in a blocking state of the transistor structure by bounding free charge carriers and may enable a higher blocking voltage, for example.

The field electrodes within the needle-shaped trenches of the array of needle-shaped trenches may be insulated from the semiconductor substrate by a field insulation layer within the needle-shaped trenches. The gate electrode within the gate trench may be insulated from a channel region of the transistor arrangement located within the semiconductor substrate by a gate insulation layer within the gate trench. For example, a thickness of the field insulation layer may be larger than two times (or larger than 5 times or larger than 10 times) a thickness of the gate insulation layer. The field insulation layer located within the needle-shaped trenches and/or the gate insulation layer within the gate trench may be oxide layers, for example. The field electrodes and the gate electrode may comprise poly silicon, for example.

A source wiring structure of a transistor arrangement may be connected to the semiconductor substrate (e.g. connected to one or more source doping regions of the transistor arrangement). For example, the source wiring structure may comprise metal (e.g. aluminum, copper and/or tungsten) and/or polysilicon. The source wiring structure may connect source doping regions of the semiconductor device (e.g. of the transistor arrangement) to a source contact interface (e.g. source pad) for connecting an external electrical device or an external source potential to one or more source regions of the transistor arrangement, for example. At least a part of the source wiring structure may be formed by the electrical conductive material embedded in the second insulation layer.

A gate wiring structure of the transistor arrangement may be connected to one or more gate electrodes of the transistor arrangement, for example. For example, the gate wiring structure may comprise metal (e.g. aluminum, copper and/or tungsten) and/or polysilicon. The gate wiring structure may connect one or more gate electrodes of the semiconductor device to a gate driver circuit implemented on the semiconductor substrate or a gate contact interface (e.g. gate pad) for connecting an external electrical device to the one or more gate electrodes of the transistor arrangement, for example. At least a part of the gate wiring structure may be formed by the electrical conductive material embedded in the second insulation layer.

For example, a first portion of the electrical conductive material embedded in the second insulation layer is used to form a part of a source wiring structure of a transistor arrangement and a second portion of the electrical conductive material embedded in the second insulation layer is used to form a part of a gate wiring structure of the transistor arrangement.

The semiconductor substrate may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or a semiconductor die.

For example, the vertical direction and a vertical dimension or thicknesses of layers may be measured orthogonal to a front side surface of the semiconductor substrate and a lateral direction and lateral dimensions may be measured in parallel to the front side surface of the semiconductor substrate.

The semiconductor substrate may comprise a cell region (or active region) laterally surrounded by an edge termination region. The cell region may be a region of the semiconductor substrate used to conduct more than 90% of a current through the semiconductor substrate in an on-state or conducting state of the transistor arrangement (or the whole semiconductor device). For example, the cell region may be an area containing all source regions of the transistor arrangement or of all transistor structures of the semiconductor device. The edge termination region may be located between an edge of the semiconductor substrate and the cell region in order to support or block or reduce or dissipate a maximal voltage applied between the front side surface of the semiconductor substrate and a back side surface of the semiconductor substrate within the cell region laterally towards the edge of the semiconductor substrate. For example, the needle-shaped trenches of the array of needle-shaped trenches are arranged within the cell region of the semiconductor substrate of the semiconductor device. The semiconductor device may further comprise a plurality of edge termination needle-shaped trenches located within the edge termination region laterally surrounding the cell region of the semiconductor device. The plurality of edge termination needle-shaped trenches may comprise field electrodes connected to the source wiring structure of the transistor arrangement. The plurality of edge termination needle-shaped trenches may improve the reliability of the edge termination, may enable a reduction of the space required by the edge termination region and/or enables an increase of a maximally bearable voltage applied to the semiconductor device.

The transistor arrangement (e.g. insulated gate field effect transistor IGFET, metal-oxide-semiconductor field effect transistor MOSFET or insulated gate bipolar transistor IGBT) may be a vertical transistor structure conducting current between a front side surface of the semiconductor substrate and a back side surface of the semiconductor substrate. For example, the transistor arrangement of the semiconductor device comprises a plurality of source doping regions connected to a source wiring structure, a plurality of gate electrodes or a gate electrode grid connected to a gate wiring structure and a back side drain metallization.

For example, the method 100 further comprise implanting dopants into the semiconductor substrate to form one or more doping regions (e.g. source region, drain region, body region, cathode region and/or anode region) of an electrical element arrangement (e.g. transistor arrangement or diode arrangement) of the semiconductor device to be formed. A breakdown voltage or blocking voltage of the electrical element arrangement may be higher than 10V.

The semiconductor device to be formed may be a power semiconductor device. A power semiconductor device or an electrical structure (e.g. transistor arrangement of the semiconductor device and/or diode arrangement of the semiconductor device) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

FIG. 2a-2j show schematic cross sections of a part of a semiconductor device at different manufacturing stages according to an embodiment. For example, FIGS. 2a-2j show processing steps of a method for forming a semiconductor device as described above (e.g. FIG. 1) or below.

Figure 2A:
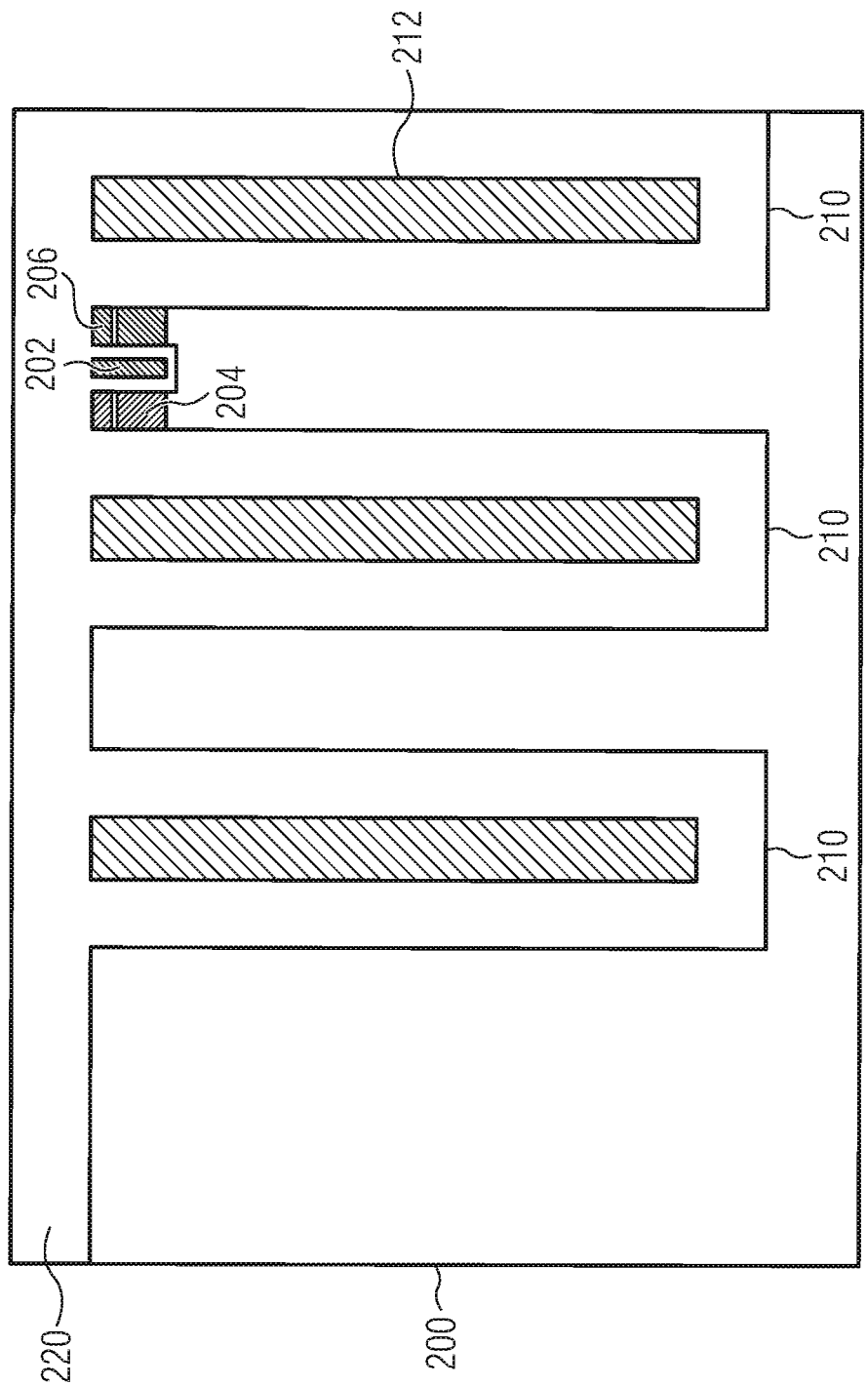

FIG. 2a shows a schematic cross section of needle-shaped trenches 210 of an array of needle-shaped trenches, field electrodes 212 located within the needle-shaped trenches 210, a gate electrode 202 located within a gate trench, source doping regions 206 and body doping regions 204 of a transistor arrangement and a first insulation layer 220 (e.g. BPSG). The first insulation layer 220 may comprise a thickness between 300 nm and 3 µm (or between 500 nm and 2 µm, for example, 1400 nm).

Further, the semiconductor substrate comprises a drift region located vertically between the body doping regions 204 and a back side surface of the semiconductor substrate 200, a drain doping region (e.g. of a MOSFET) or a collector doping region (e.g. of an IGBT) or a highly doped bulk region of the semiconductor substrate.

Figure 2B:
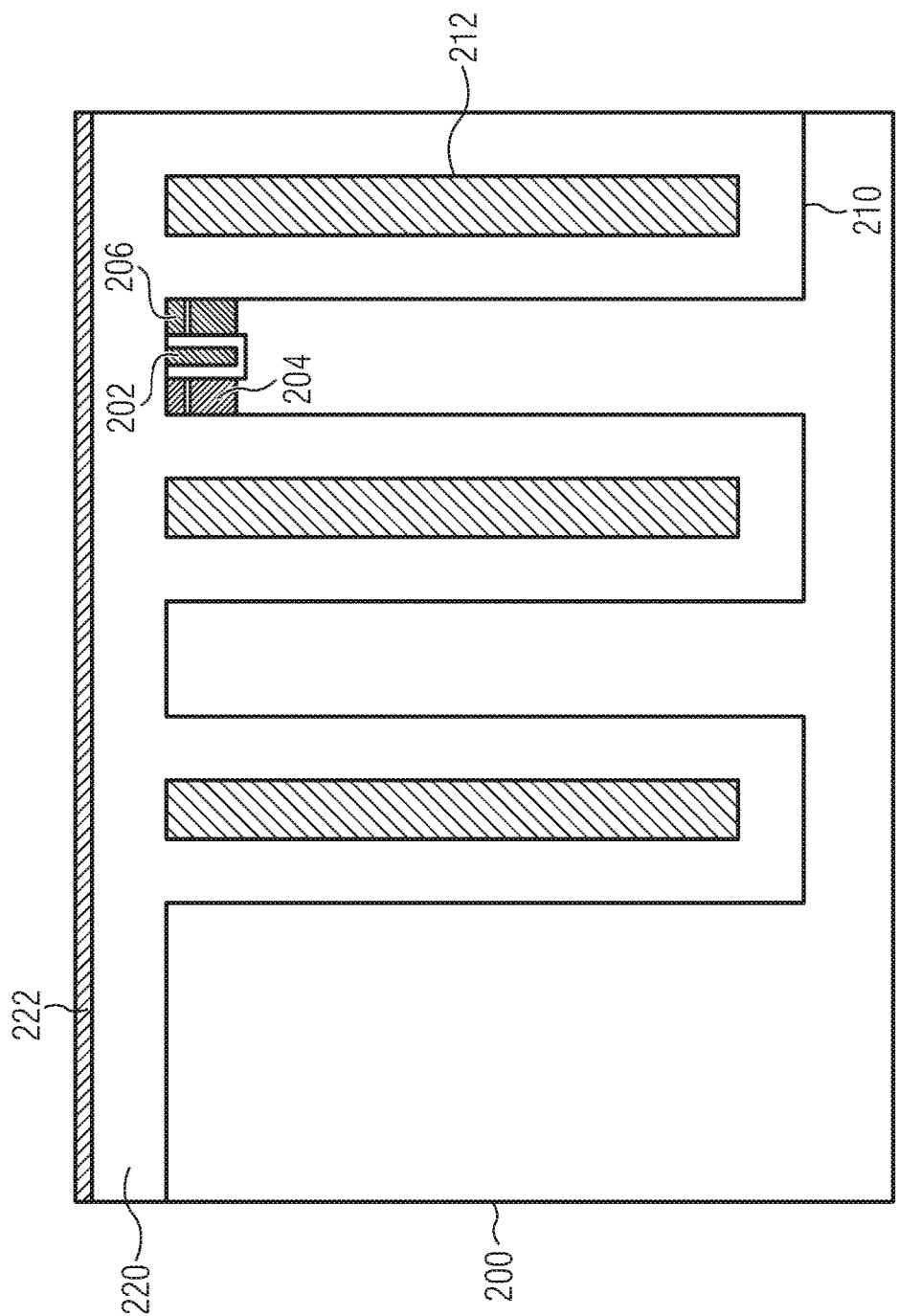

Then an etch stop layer 222 (e.g. silicon nitride or another layer, which can be etched selectively to oxide) is deposited on the first insulation layer (first inter layer dielectric ILD1) as shown in FIG. 2b.

Figure 2C:
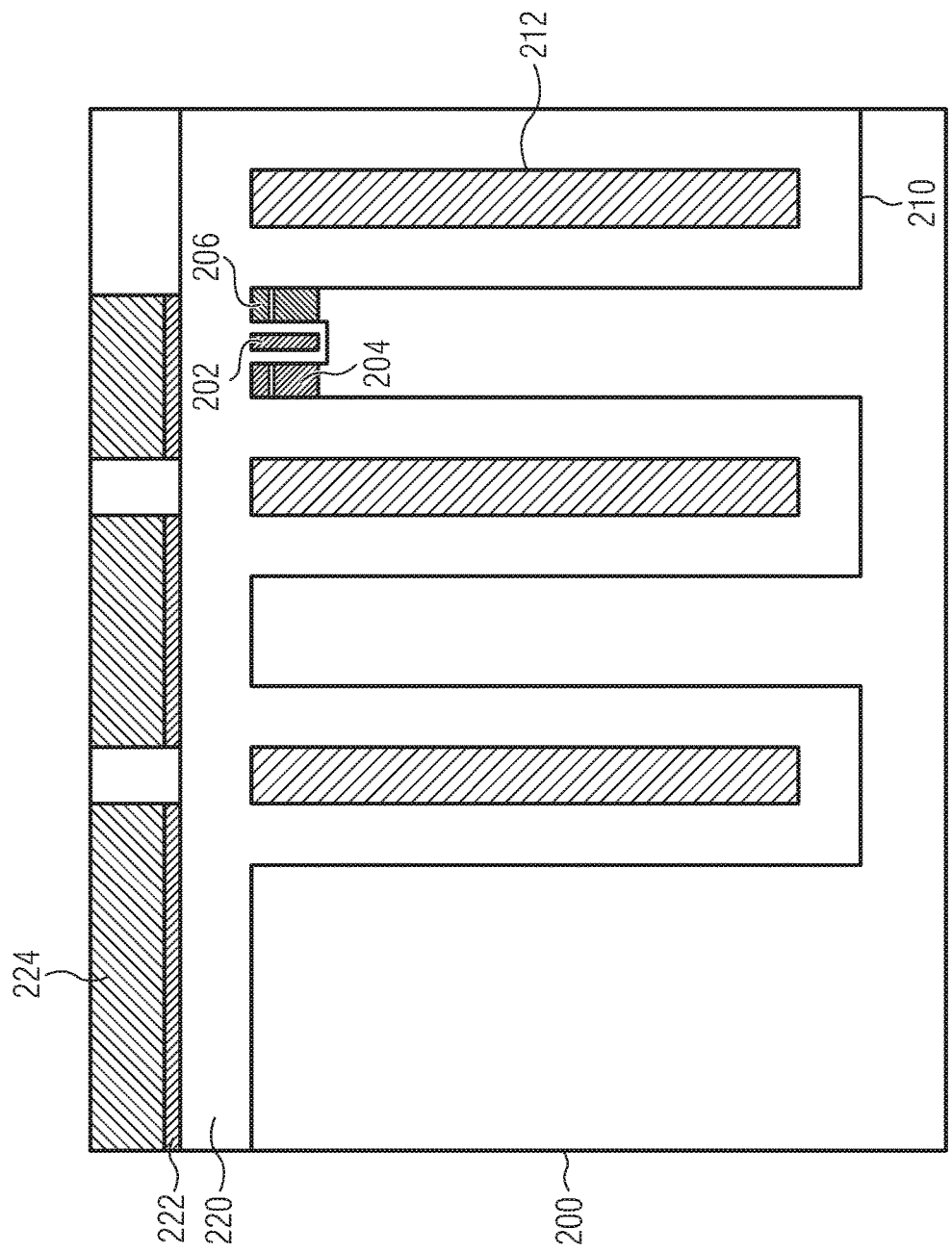

Afterwards a photo resist layer 224 is deposited on a substantially planar surface (formed by the etch stop layer) and structured based on a lithography process (litho contact). Further, the etch stop layer 222 is structured by an etching process (e.g. nitride etch) as shown in FIG. 2c.

Figure 2D:
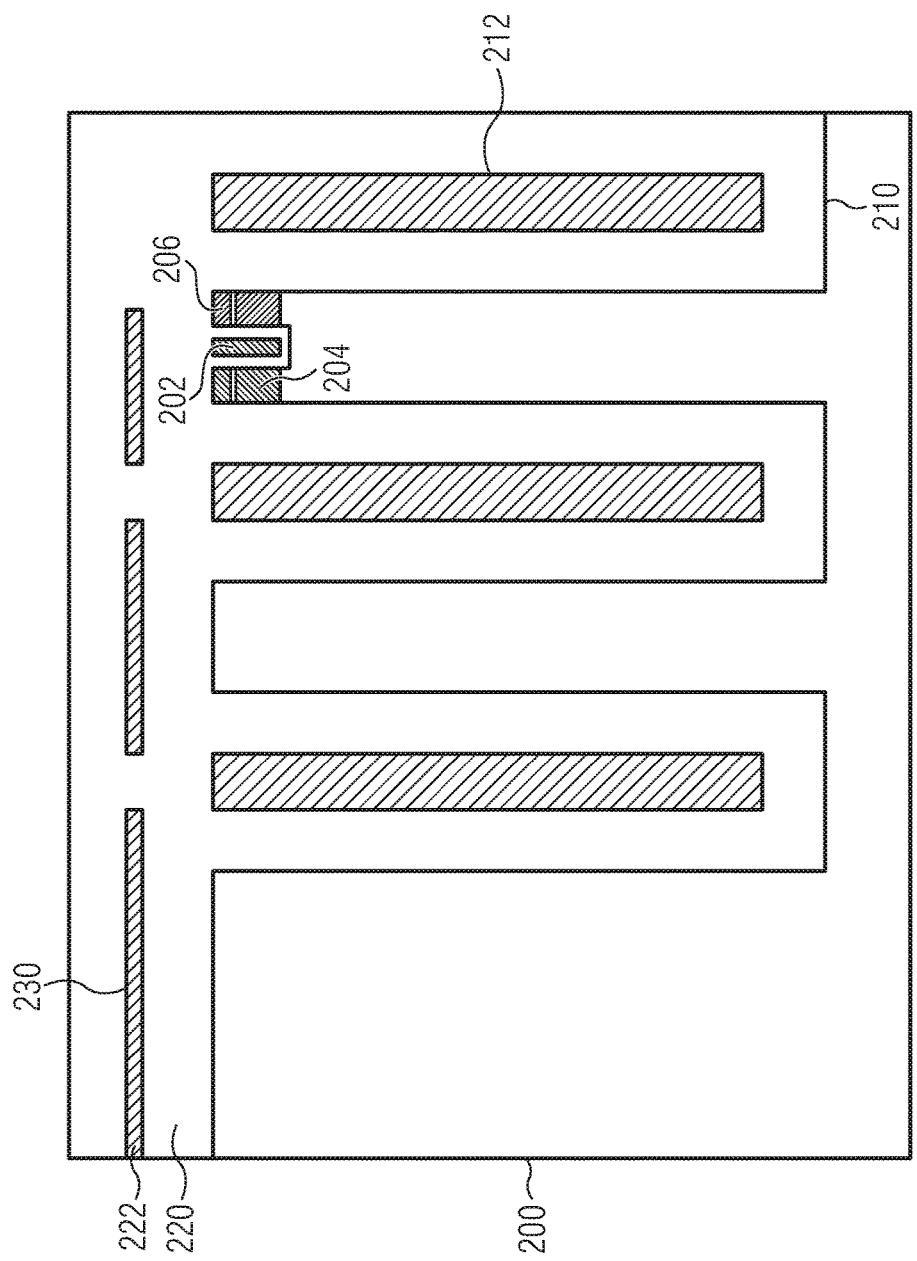

Then, the photo resist layer 224 is removed and a second insulation layer 230 (second inter layer dielectric ILD2) is deposited as shown in FIG. 2d. The second insulation layer 230 may be a USG layer, a PSG layer or a BPSG layer, for example. The second insulation layer 230 may comprise a thickness between 100 nm and 800 nm (or between 300 nm and 600 nm, for example, 500 nm). Optionally, an additional reflow process (e.g. heating the second insulation layer above a reflow temperature) may be performed.

Figure 2E:
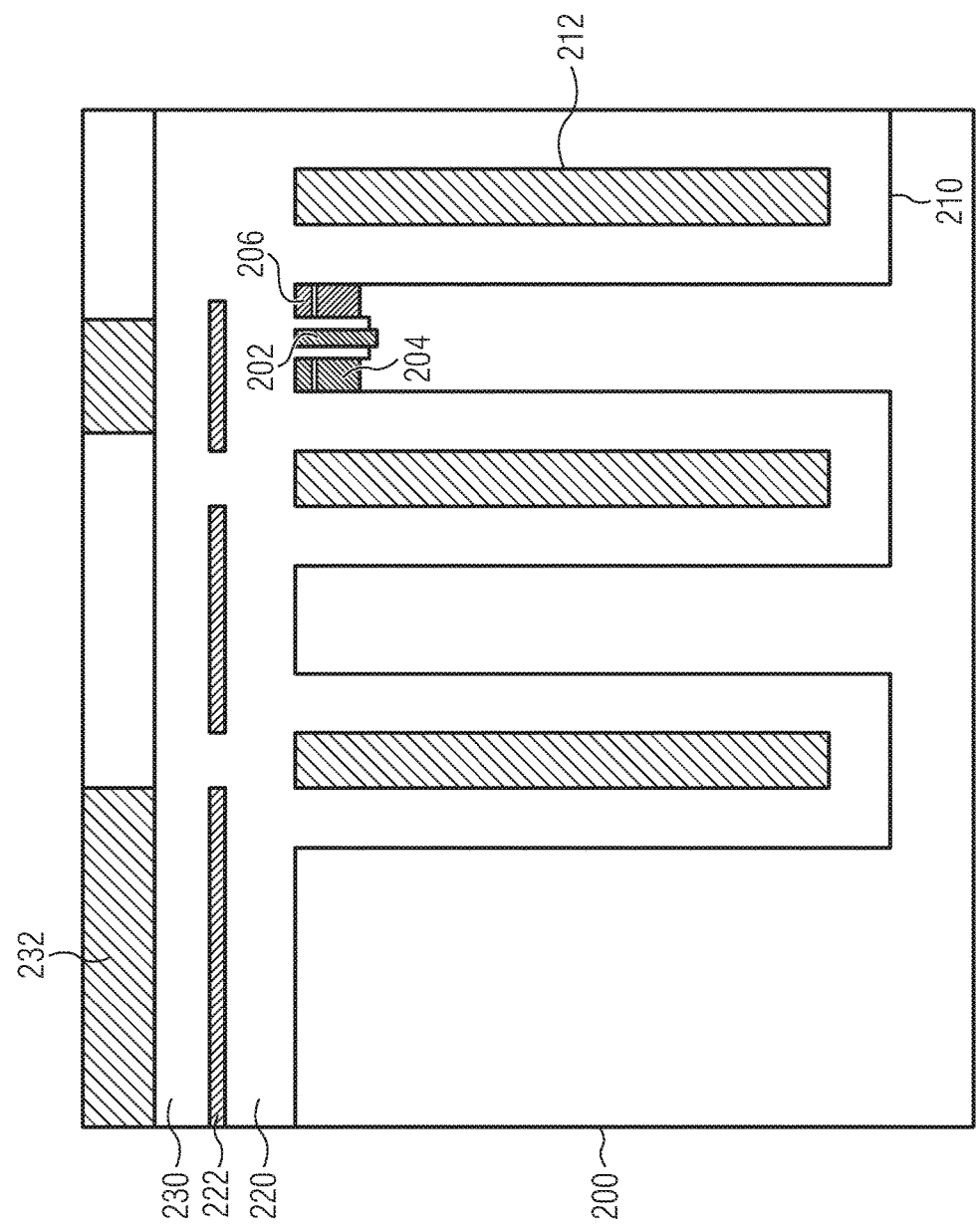

Afterwards, a photo resist layer 232 is deposited on a substantially planar surface (formed by the second insulation layer) and structured based on a lithography process (litho via) as shown in FIG. 2e.

Figure 2F:
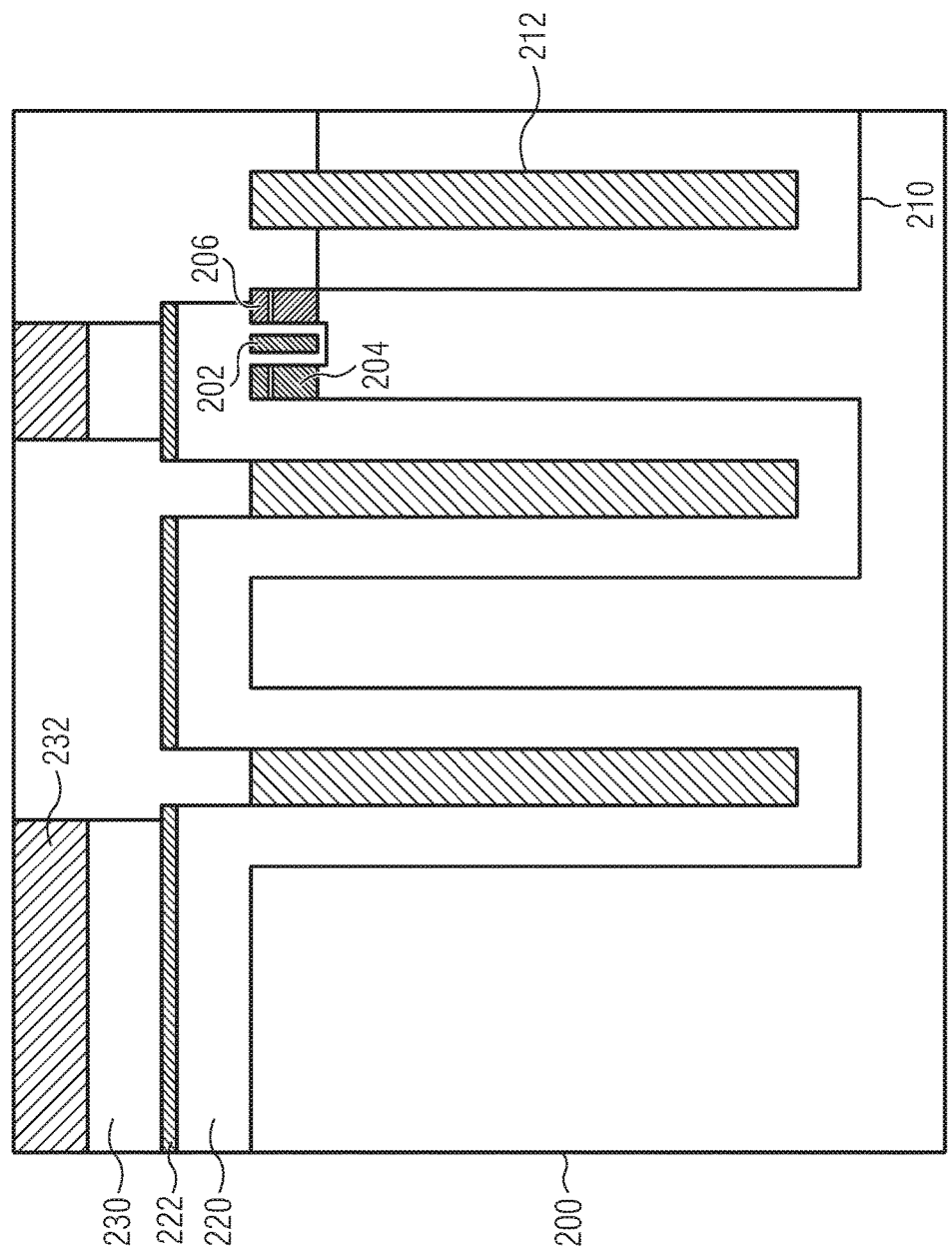

Then, uncovered portions of the first and second insulation layers are simultaneously etched by an anisotropic etching process (e.g. dry chemical etching) as shown in FIG. 2f. For example, an oxide etch selective to nitride and silicon (e.g. selectivity to nitride up to 20:1 and selectivity to silicon even higher) is performed. The etch stop layer 222 works as buried etch stop during the simultaneously etching of the first and second insulation layer. The simultaneously etching of the first and second insulation layer uncovers the field electrodes within the needle-shaped trenches and source doping regions 206 and body doping regions 204 at a surface of the semiconductor substrate 200.

Afterwards, the photo resist layer 232 is removed and grooves are etched into the semiconductor substrate 200 at the source doping regions 206 and body doping regions 204 as shown in FIG. 2g. Further, highly doped contact regions at the surface of the source doping regions 206 and body doping regions 204 are implanted (contact $I^2$, Pt $I^2$) to enable an ohmic contact to the source doping regions 206 and body doping regions 204, for example.

Figure 2H:
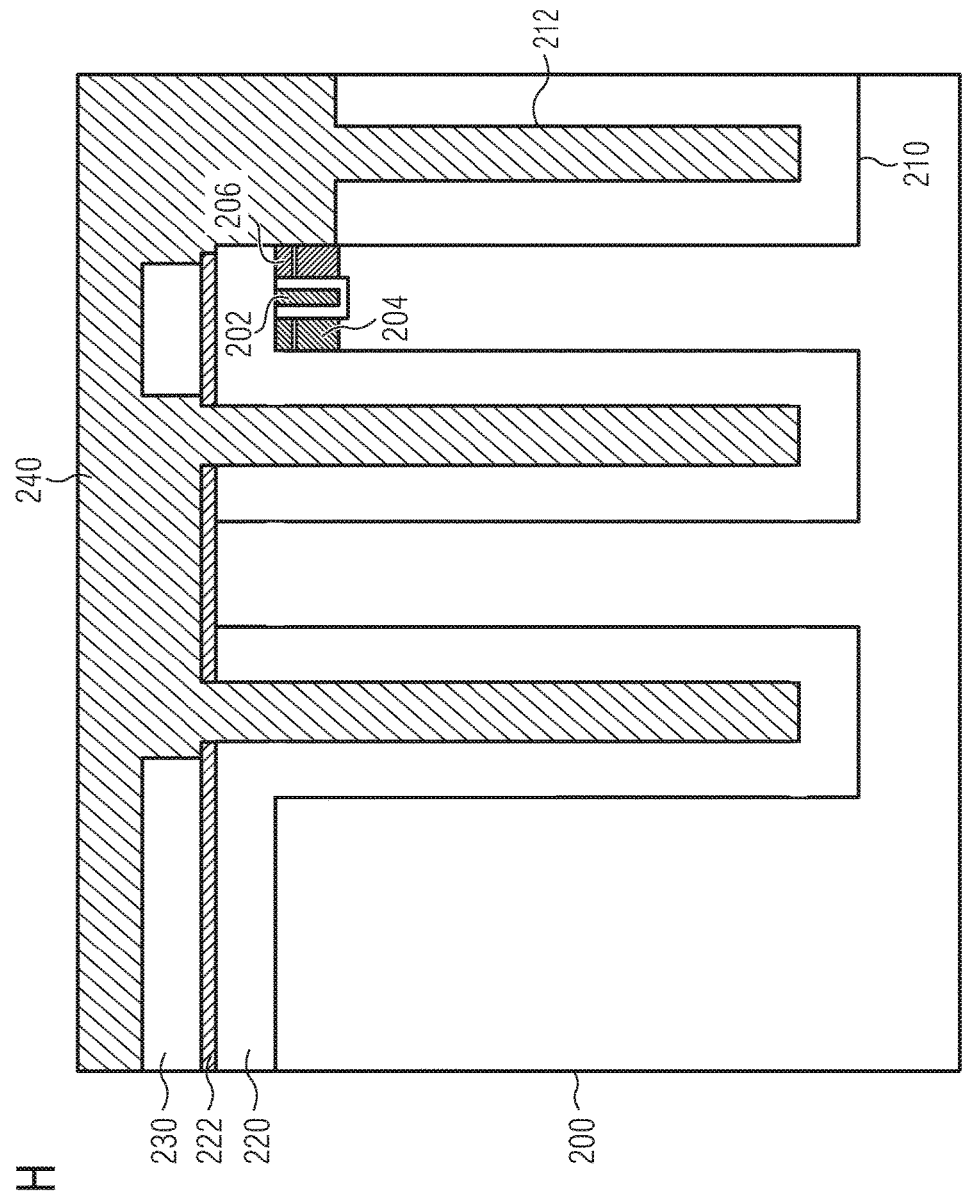
Figure 21:
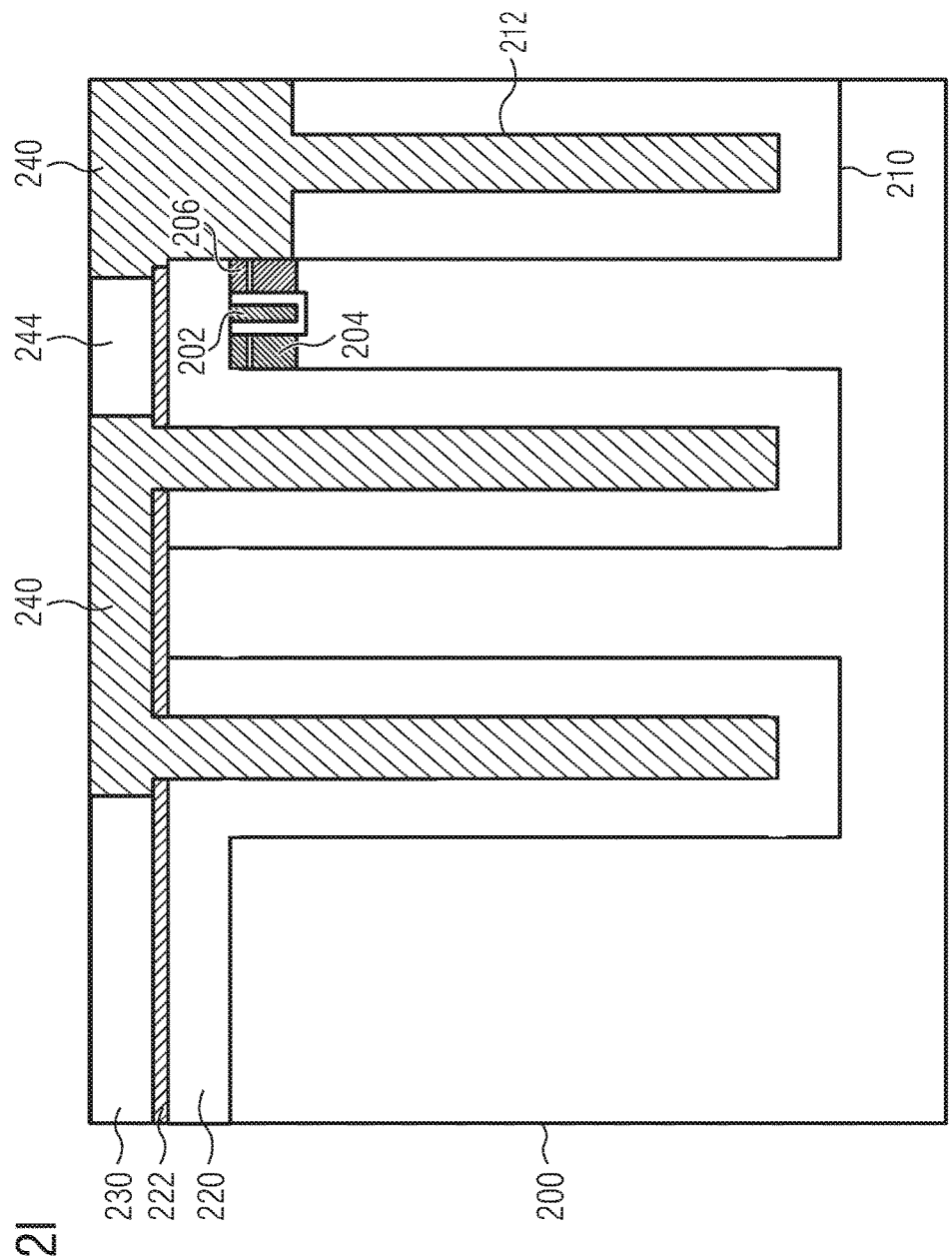

Then, titanium and titanium nitride is deposited and a titanium silicide formation is effected. Further, tungsten 240 (electrically conductive material) is deposited by chemical vapor deposition (W-CVD) as shown in FIG. 2h. The tungsten may be overfilled and high stress conformal.

Afterwards, the tungsten 240 is partly removed or thinned by CMP or plasma etch planarization with a stop on the oxide of the second insulation layer as shown in FIG. 2i. Islands of electrically conductive material may be surrounded by portions 244 of the second insulation layer, which may work as anti dishing pillars during the CMP.

Figure 2J:
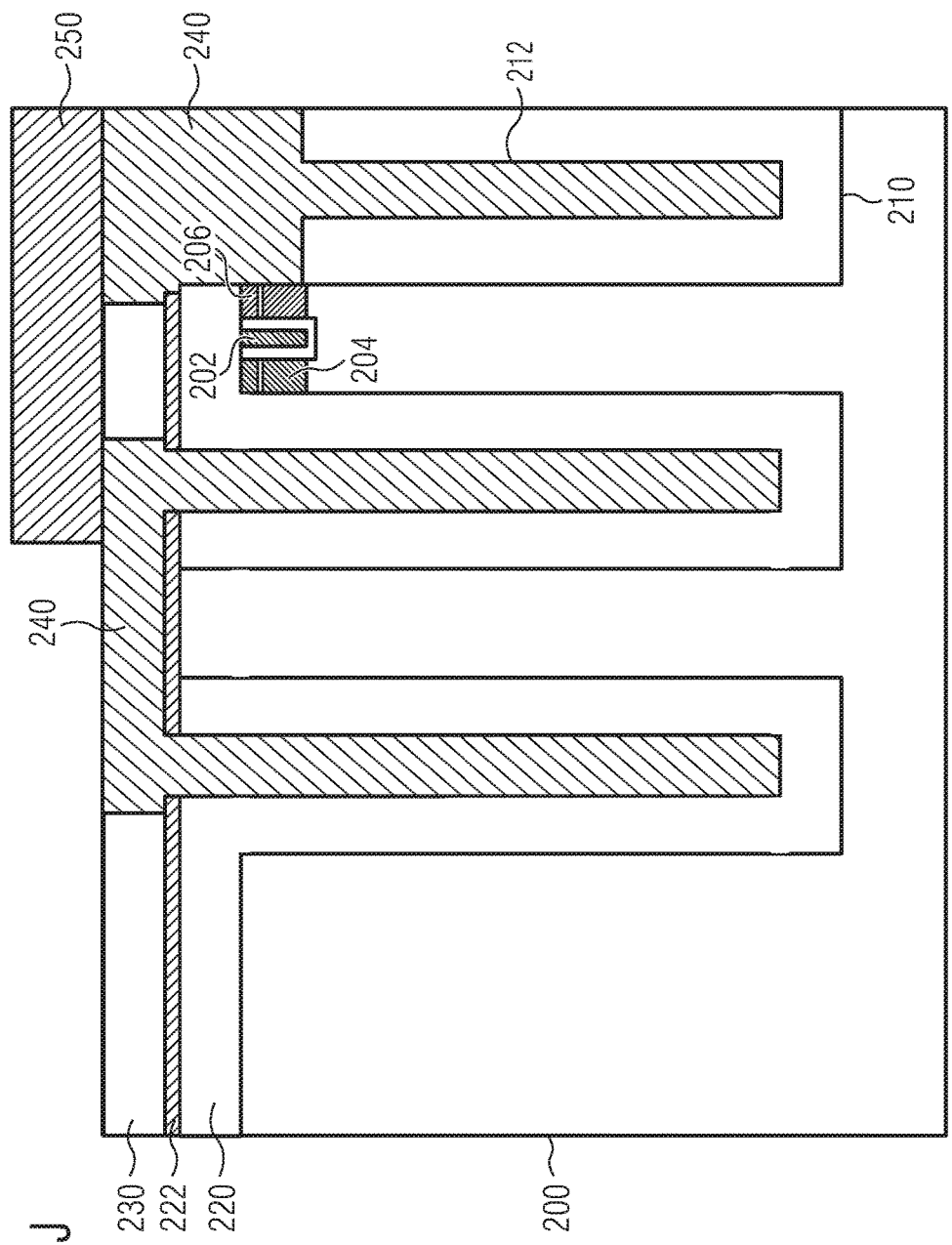

Then, a power metal layer 250 (e.g. aluminum copper AlCu) is deposited and structured as shown in FIG. 2j. At least a part of the power metal layer 250 may be located at a source pad position or may implement at least a part of a source pad, for example. The field electrodes 212 within the needle-shaped trenches 210, the source doping regions 206 of the transistor arrangement and the body doping regions 204 of the transistor arrangement are electrically connected to power metal layer 250 through the deposited tungsten 240 (electrically conductive material).

By using the proposed manufacturing method, all litho steps may be done on (substantially) even surfaces and CMP can stop on ILD2, for example. Also less dishing due to ILD2 structures in the cell field may be achievable.

FIG. 2a-2j show schematic cross sections through an edge of a cell region of a transistor arrangement orthogonal to a gate trench. The cell region is shown at the right side of these figures and the edge termination region is shown at the left side of the figures. No gate as well as source and body regions are located between the two outermost needle-shaped trenches 210. Coming from the left side (chip edge), first neither body nor source are implemented, then body in portions of the edge termination is implemented and then in active cell field body as well as source is implemented.

Figure 3:
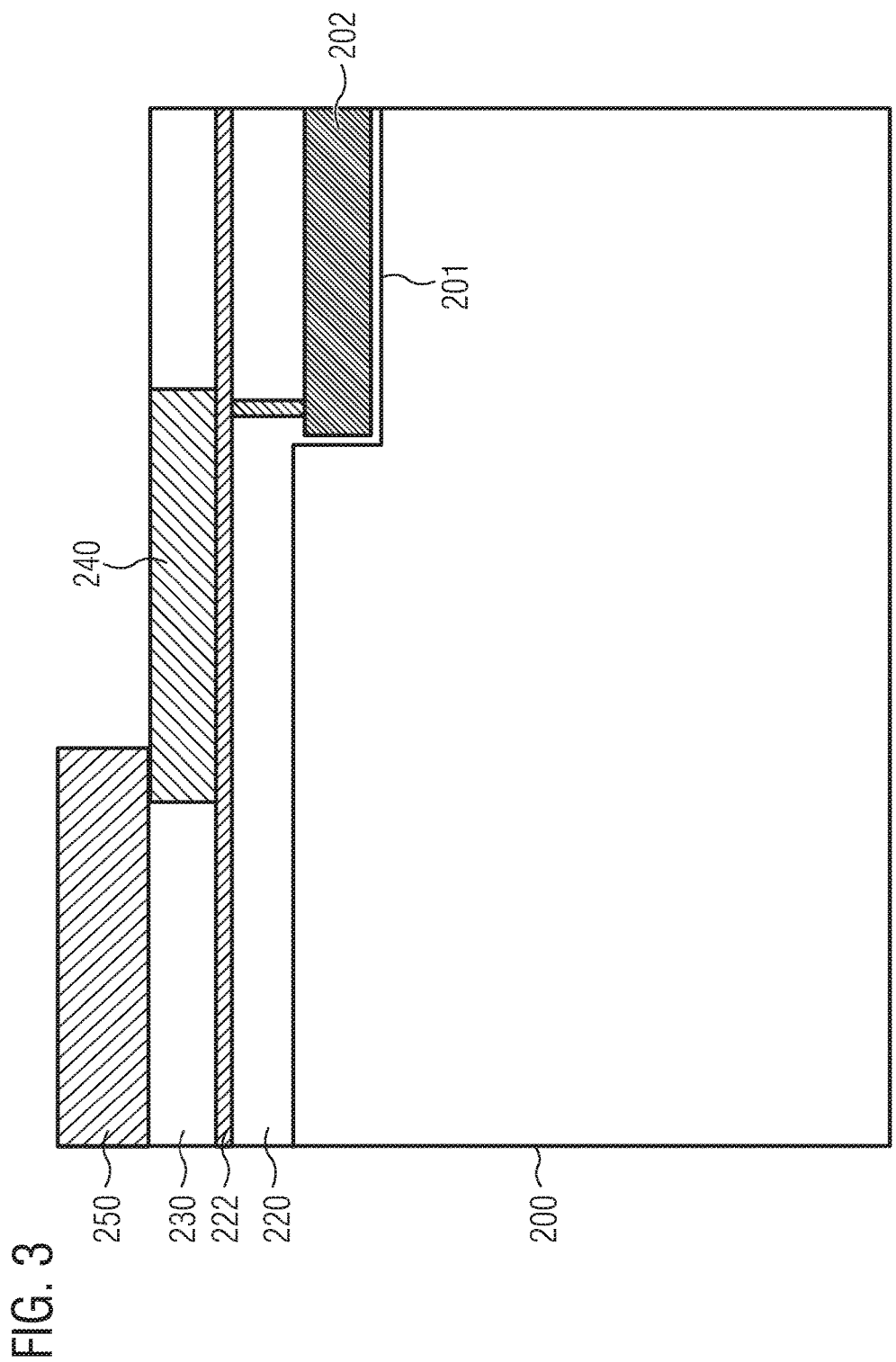
FIG. 3 shows a schematic cross section of another part of the semiconductor device shown in FIG. 2a-2j.

FIG. 3 shows a schematic cross section of another part (gate pad position) of the semiconductor device shown in FIG. 2a-2j. FIG. 3 shows a cross section of an edge of the cell region in parallel to a gate trench 201. The gate electrode 202 is electrical connected to a gate pad through an electrical contact between the gate electrode 202 and a portion of the deposited Ti/TiN/W layer structure 240 and an electrical contact between a portion of the power metal layer 250 (e.g. implementing a gate ring or gate runner) and a portion of the deposited Ti/TiN/W layer structure 240.

More details and aspects of the method described in connection with FIG. 2a-2j and 3 are mentioned in connection with the proposed concept or one or more examples described above. The described method may comprise one or more additional optional features corresponding to one or more aspects of the proposed concept or one or more examples described above (e.g. FIG. 1) or below (e.g. FIG. 4a-6b).

A transistor arrangement of a semiconductor device to be formed may comprise a plurality of transistor cells (e.g. more than 50 cells, more than 100 cells or more than 500 cells) within the cell region of the semiconductor device.

Figure 4A:
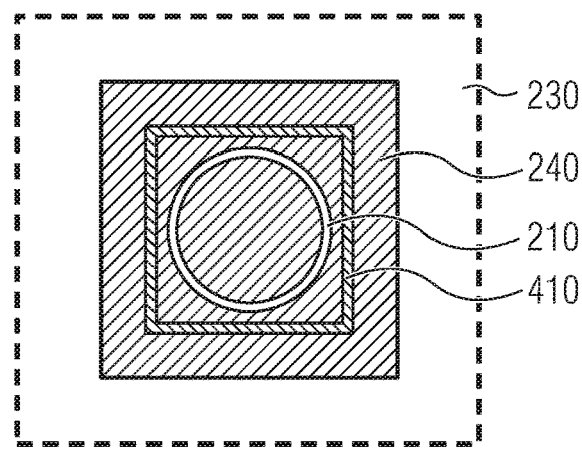
FIG. 4a shows a schematic top view of a part of a semiconductor device including a needle-shaped trench.

FIG. 4a shows a schematic top view of a part of a transistor cell of a semiconductor device including a needle-shaped trench. The needle shaped trench 210 comprises laterally a circular shape. Further, the etch stop layer 222 comprises a square-shaped (or round or octagonal or hexagonal) opening 410 (contact layer) for the vertical electrical contact through the first insulation layer to the field electrode within the needle-shaped trench 210 and the source and body region of the transistor cell of the transistor arrangement. The opening 410 is slightly larger than the needle-shaped trench 210 to enable a contact to the source and body region of the transistor cell at an edge of the needle-shaped trench 210. The electrical conductive material 240 (via layer) is laterally surrounded by insulating material within the second insulation layer 230 (e.g. oxide for CMP stop).

FIG. 4b-4e show schematic cross sections of transistor cells of different semiconductor devices. For example, mesa and needle contact unit cells are shown. Each of the cross sections shows a needle-shaped trench 210 and neighboring gate trenches with gate electrodes 202. The variants may differ in the aspect ratio for easier W-CVD fill and/or oxide/tungsten ratio for better W-CMP anti dishing, for example.

Figure 4B:
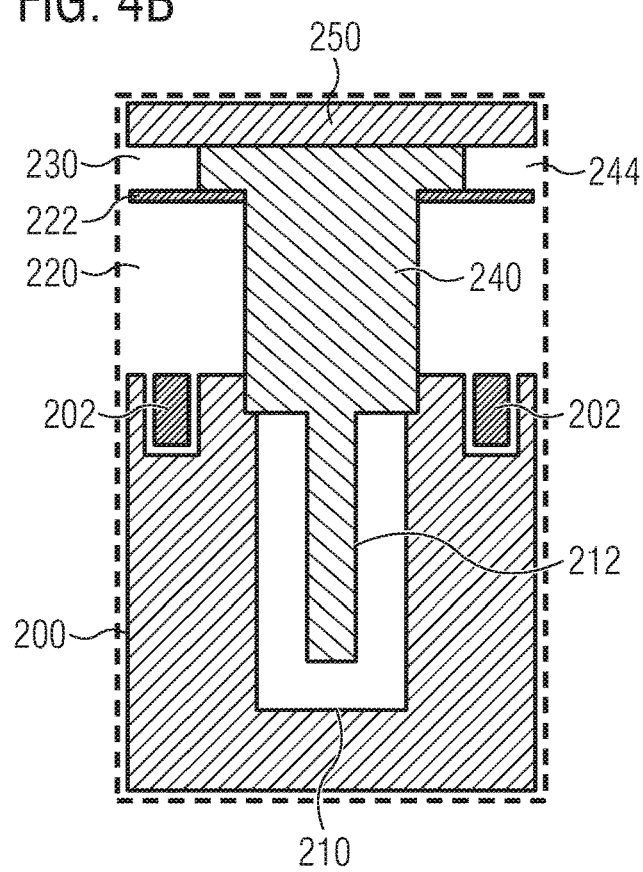
FIG. 4b-4e shows schematic cross sections of unit cells of different semiconductor devices.

FIG. 4b shows a cross section of a transistor cells corresponding to the top view shown in FIG. 4a. Portions 244 of the second insulation layer 230 surrounding the electrical conductive material 240 embedded in the second insulation layer 230 may be used for CMP stop. The etch stop layer is used to define the geometry of the vertical electrical contact through the first insulation layer 220 and the electrical conductive material (tungsten) occupies a larger lateral area within the second insulation layer 230 than in the first insulation layer 220.

Figure 4C:
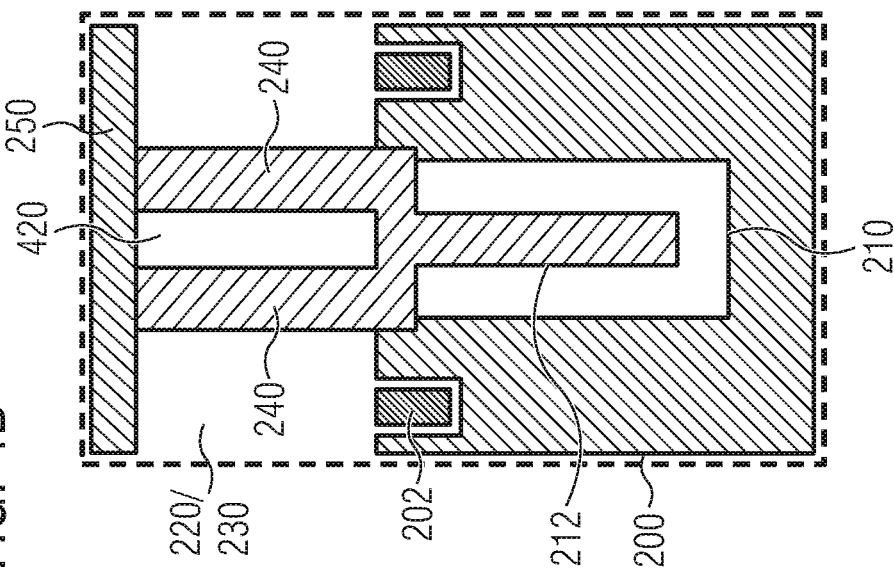

In comparison to the example shown in FIG. 4b, the etch stop layer is removed within the cell region of the semiconductor device shown in FIG. 4c. The etch stop layer is used for implementing wiring structures (e.g. source wiring fingers, gate wiring fingers and/or gate runner) at the edge of the cell region. Consequently, the first insulation layer 220 and the second insulation layer form a thick insulation layer within the cell region.

Figure 4D:
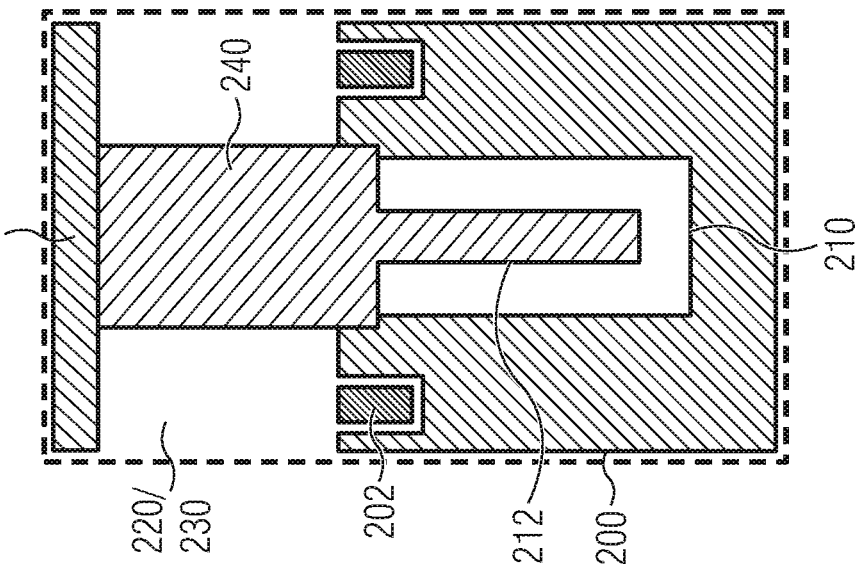

In comparison to the example shown in FIG. 4c, a core of insulating material 420 remains in the center of the electrical conductive material 240 of the semiconductor device shown in FIG. 4d.

Figure 4E:
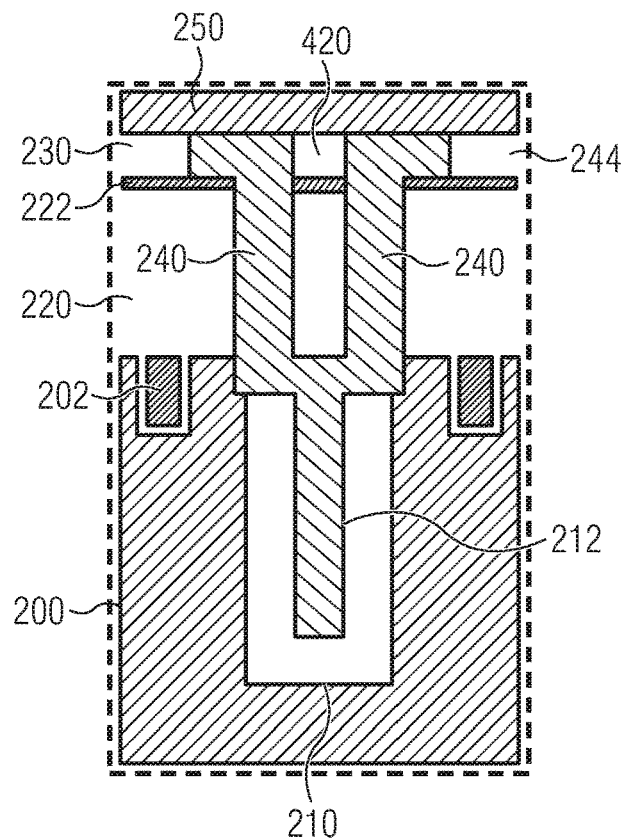

In comparison to the example shown in FIG. 4b, a core of insulating material 420 remains in the center of the electrical conductive material 240 of the semiconductor device shown in FIG. 4e.

More details and aspects of the examples described in connection with FIG. 4a-4e are mentioned in connection with the proposed concept or one or more examples described above. The described examples may comprise one or more additional optional features corresponding to one or more aspects of the proposed concept or one or more examples described above (e.g. FIG. 1-3) or below (e.g. FIG. 5-6*b*).

Figure 5:
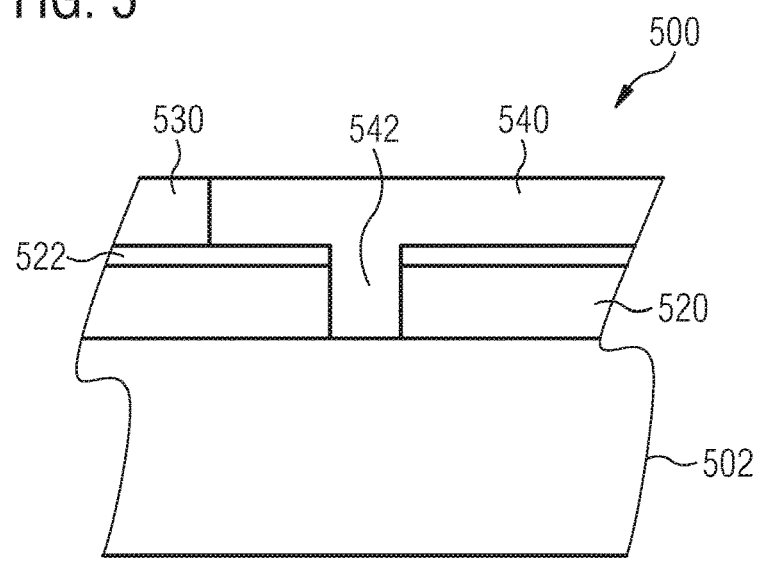
FIG. 5 shows a schematic cross section of a part of a semiconductor device.

FIG. 5 shows a schematic cross section of a part of a semiconductor device according to an embodiment. The semiconductor device 500 comprises a semiconductor substrate 502 and a layer stack comprising at least an insulation layer 520, a structured etch stop layer 522 and a lower most lateral wiring layer. The insulation layer 520 is located adjacent to the semiconductor substrate 502 and the structured etch stop layer 522 is located between the insulation layer 520 and the lower most lateral wiring layer. Further, a wiring structure comprises a vertical wiring portion 542 extending from the lower most lateral wiring layer vertically to the semiconductor substrate 502 (as shown in FIG. 5) and/or an electrode located within a trench (not shown in FIG. 5). The vertical wiring portion 542 and electrical conductive portions 540 of the lower most lateral wiring layer are manufacturable simultaneously.

By using a structured mask layer between two insulation layers, a lateral and vertical wiring structure for contacting electrodes in trenches and/or for contacting the semiconductor substrate may be formable. Further, a planarization by chemical-mechanical polishing may be enabled, since the electrically conductive material is embedded in the insulation layers. In this way, a substantially even surface may be provided for following manufacturing processes. Therefore, the defect density may be reduced and/or the yield may be increased.

The lower most lateral wiring layer comprises portions of insulating material 530 (e.g. silicon oxide) embedding electrical conductive material 540 (e.g. tungsten).

For example, the vertical wiring portion 542 and electrical conductive portions of the lower most lateral wiring layer are manufacturable or formable (manufactured or formed) simultaneously, since the vertical wiring portion and electrically conductive portions of the lower most lateral wiring layer may comprise substantially the same material composition (e.g. Ti/TiN/W, aluminum or copper). For example, the insulating material of the lower most lateral wiring layer and the material of the insulation layer 520 may be etched by the same etching process.

The wiring structure may comprise one or more electrical conductive material portions within the lower most lateral wiring layer and one or more vertical wiring portions extending vertically through the insulation layer. Further, the wiring structure may comprise electrically conductive portions within one or more lateral wiring layers and/or one or more vertical wiring layers above the lower most lateral wiring layer. The wiring structure may be a source wiring structure or a gate wiring structure of a transistor arrangement.

A lateral wiring layer (e.g. metal layer of a layer stack of a semiconductor device) may be a layer for implementing lateral electrical connections between vertical electrical connections (vias) connecting lateral wiring layers. A vertical wiring layer (e.g. via layer of a layer stack of a semiconductor device) may be a layer for implementing vertical electrical connections (vias) between lateral wiring layers.

The layer stack of the semiconductor device 500 may comprise at least one vertical wiring layer, which is implemented by the insulation layer 520 and one or more vertical wiring portions 542 of one or more wiring structures extending vertically through the insulation layer 520, and at least one lateral wiring layer, which is implemented by the lower most lateral wiring layer. The layer stack of the semiconductor device 500 may comprise one or more lateral wiring layers and/or vertical wiring layers above the lower most lateral wiring layer. The lower most lateral wiring layer may be the lateral wiring layer of the layer stack of the semiconductor device 500 located closest to the semiconductor substrate 502.

For example, the lower most lateral wiring layer may be the upper most lateral wiring layer as well, if the lower most lateral wiring layer is the only lateral wiring layer of the semiconductor device.

More details and aspects of the semiconductor device 500 are mentioned in connection with the proposed concept or one or more examples described above. The semiconductor device 500 may comprise one or more additional optional features corresponding to one or more aspects of the proposed concept or one or more examples described above (e.g. FIG. 1-4*e*) or below (e.g. FIG. 6*a*-6*b*).

FIGS. 6*a* and 6*b* show a schematic cross section and a schematic top view of a power semiconductor device according to an embodiment. The power semiconductor device 600 comprises a semiconductor substrate 602 comprising an electrical element arrangement (e.g. transistor arrangement or diode arrangement) located within a cell region 604 of the semiconductor substrate 602. A blocking voltage of the electrical element arrangement is higher than 10V. Further, the semiconductor device 600 comprises a lateral wiring layer. One or more electrically conductive structures 632 of the lateral wiring layer are embedded by insulating material of the lateral wiring layer. Portions 634 of the insulating material of the lateral wiring layer are located within the cell region 604 of the semiconductor device 600. Additionally, the semiconductor device 600 comprises a metal layer 650 located on the lateral wiring layer. The metal layer 650 covers the portions 634 of the insulating material of the lateral wiring layer located within the cell region 604. For example, the metal layer 650 is in contact with the portions 634 of the insulating material of the lateral wiring layer located within the cell region 604. The metal layer 650 may be formed on the portions 634 of the insulating material without another insulating material layer formed in between. For example, the metal layer 650 may be formed on a substantially even surface formed by the portions 634 of the insulating material of the lateral wiring layer and the one or more electrically conductive structures 632 of the lateral wiring layer embedded by the insulating material of the lateral wiring layer.

The portions of insulating material within the cell region may suppress dishing effects during CMP, for example. In this way, a substantially even surface may be provided for following manufacturing processes. Therefore, the defect density may be reduced and/or the yield may be increased.

For example, the semiconductor device comprises an array of needle-shaped trenches within the cell region 604. The needle-shaped trenches may comprise field electrodes. Each field electrode of the needle-shaped trenches may be connected to an electrically conductive structures 632 of the lateral wiring layer embedded by insulating material. For example, the electrically conductive structures 632 of the lateral wiring layer may form islands of electrically conductive material laterally surrounded by insulating material of the lateral wiring layer within the cell region 604.

More details and aspects of the semiconductor device 600 are mentioned in connection with the proposed concept or one or more examples described above. The semiconductor device 600 may comprise one or more additional optional features corresponding to one or more aspects of the proposed concept or one or more examples described above (e.g. FIG. 1-5) or below.

Some embodiments relate to a damascene contact for needle trenches. For example, a damascene based BEOL (back end of line) process and structure for contacting Si-Mesa (silicon mesa), Needle Trench field plate and gate trench in a needle trench device may be proposed. Based on the proposed concept, more reliable devices due to less defect density/higher yield at the same/similar manufacturing costs may be enabled.

Structural features may be that the silicon Si-mesa (e.g. comprising source and body) and the field plate of the needle trench are connected via a contact unit cell to the metallic source pad. Further, the unit cells may be arranged in a square or hexagonal lattice. The plug material (material of the vertical connection through the first insulation layer) of one unit cell may be electrically isolated by ILD1/2 from its neighboring unit cells. Furthermore, the gaterunner may be connected to the gate trench via a wire embedded in ILD2 (e.g. not exposed on top of ILD1). Additionally, the edge termination trenches may be connected to the source pad via a wire embedded in ILD2 (e.g. not exposed on top of ILD1).

BEOL structures may have the function of contacting Si-Mesa, Field Plate and Gatetrench. Some used BEOL structures and processes may provide difficulties, for example, due to small oxide structures and patterning of the tungsten layer, using resist and plasma etch.

According to an aspect of the proposed concept, no small oxide bars may be needed to divide laterally large and deep tungsten structures in several laterally smaller portions due to the applicable CMP process. Further, a lower aspect ratio and/or high stress tungsten deposition may be possible, because a continuous W-plate can be split into unit cells. Furthermore, less mechanical stress may be caused and/or a more conformal fill may be enabled. Additionally, tungsten W and contact litho may be preformed on a (substantially) even surface. The topography may be reduced. Further, CMP process with endpoint and/or overpolish may be applicable.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate;
needle-shaped trenches in the semiconductor substrate, each needle-shaped trench including a field electrode electrically insulated from the semiconductor substrate;
source doping regions and body doping regions of a transistor arrangement in the semiconductor substrate between neighboring ones of the needle-shaped trenches;
gate trenches extending through the source doping regions and the body doping regions;
a first insulation layer above the semiconductor substrate;
an etch stop layer on the first insulation layer, the etch stop layer being etchable selective to the first insulation layer;
a second insulation layer on the etch stop layer; and
an electrically conductive material on the second insulation layer,
wherein the electrically conductive material contacts the field electrodes, the source doping regions and the body doping regions through openings which extend through the second insulation layer, the etch stop layer and the first insulation layer,
wherein islands of the electrically conductive material are surrounded by portions of the second insulation layer above the gate trenches.

2. The semiconductor device of claim 1, wherein the first insulation layer has a thickness between 300 nm and 3 μm.

3. The semiconductor device of claim 1, wherein the second insulation layer has a thickness between 100 nm and 800 nm.

4. The semiconductor device of claim 1, wherein the electrically conductive material is tungsten.

5. The semiconductor device of claim 1, further comprising a power metal layer on the electrically conductive material.

6. The semiconductor device of claim 5, wherein at least a part of the power metal layer is located at a source pad position or implements at least a part of a source pad.

7. The semiconductor device of claim 5, wherein the source doping regions and the body doping regions are electrically connected to the power metal layer through the electrically conductive material.

8. The semiconductor device of claim 5, wherein the power metal layer comprises AlCu.

9. The semiconductor device of claim 5, wherein above the gate trenches, portions of the second insulation layer are vertically interposed between the etch stop layer and the power metal layer.

10. The semiconductor device of claim 1, further comprising an edge termination region in the semiconductor substrate and including some of the needle-shaped trenches but none of the body doping regions and none of the gate trenches.

11. The semiconductor device of claim 1, wherein the electrically conductive material occupies a larger lateral area within the second insulation layer than in the first insulation layer.

12. The semiconductor device of claim 1, wherein the etch stop layer is omitted from a cell region of the transistor arrangement.

13. The semiconductor device of claim 1, further comprising a core of insulating material in a center of the electrically conductive material in a region of the electrically conductive material which vertically extends to the field electrodes.

14. The semiconductor device of claim 1, wherein the needle-shaped trenches have a circular shape in a plane parallel to a main surface of the semiconductor substrate, and wherein a rectilinear-shaped opening is formed in the etch stop layer above the needle-shaped trenches.

15. The semiconductor device of claim 14, wherein the rectilinear-shaped openings in the etch stop layer are larger than a diameter of the needle-shaped trenches.

16. The semiconductor device of claim 1, wherein the electrically conductive material contacts the source doping regions and the body doping regions along a recessed region of the semiconductor substrate.

17. The semiconductor device of claim 1, wherein between neighboring ones of the needle-shaped trenches, the electrically conductive material laterally extends along a surface of the etch stop layer which faces away from the semiconductor substrate, and wherein above the needle-shaped trenches, the electrically conductive material vertically extends to the field electrodes through the openings in the second insulation layer, the etch stop layer and the first insulation layer.

18. The semiconductor device of claim 1, wherein the portions of the second insulation layer above the gate trenches contact a surface of the etch stop layer which faces away from the semiconductor substrate.

* * * * *